United States Patent [19]

Mizoguchi

[11] Patent Number: 5,008,857

[45] Date of Patent: Apr. 16, 1991

[54] SEMICONDUCTOR MEMORY DEVICE PROVIDED WITH AN IMPROVED SYSTEM FOR DETECTING THE POSITIONS USING A REDUNDANT STRUCTURE

[75] Inventor: Akane Mizoguchi, Tokyo, Japan

[73] Assignee: NEC Corporation, Tokyo, Japan

[21] Appl. No.: 563,890

[22] Filed: Aug. 8, 1990

Related U.S. Application Data

[63] Continuation of Ser. No. 385,528, Jul. 27, 1989, abandoned.

[51] Int. Cl.$^5$ ............................................. G11C 13/00
[52] U.S. Cl. ..................................... 365/200; 365/95; 365/189.01
[58] Field of Search ...................... 365/189.01, 200, 95, 365/230.01

[56] References Cited

U.S. PATENT DOCUMENTS 4,885,720 12/1989 Miller et al. .................. 365/200

Primary Examiner—Terrell W. Fears
Attorney, Agent, or Firm—Sughrue, Mion, Zinn Macpeak & Seas

[57] ABSTRACT

A semiconductor memory device provided with an improved system for detecting an address of a defective column or row of memory cells replaced by a redundant column or row of memory cells through an output port comprises normal memory cells, at least one redundant memory cell, a power-on detection for generating a detection signal when a power supply to the memory circuit is switched on, a first circuit for initializing the normal memory cells at a first logic state in response to the detection signal, and a second circuit for initializing the redundant memory cell at a second logic state different from the first logic state in response to the detection signal.

5 Claims, 4 Drawing Sheets

SEMICONDUCTOR MEMORY DEVICE PROVIDED WITH AN IMPROVED SYSTEM FOR DETECTING THE POSITIONS USING A REDUNDANT STRUCTURE

This is a continuation of application Ser. No. 385,528, filed July 27, 1989, now abandoned.

BACKGROUND OF THE INVENTION

1. Field of the Invention

The present invention relates to a semiconductor memory device having a redundant structure, and more particularly to a system for detecting the memory cell positions using the redundant structure.

2. Description of the Related Art

Memory capacity of semiconductor memory device has been remarkably increasing. With the increase in the capacity of semiconductor memories, redundant circuit technology has been introduced. The redundant circuit has a redundant column or row of memory cells which are added for a normal memory cell array and a redundant decoder for selecting the redundant column or row of memory cells. If the normal memory cell array contains any defective memory cells in a column or a row, the address corresponding to the defective column or row of memory cells is programmed into the redundant decoder in a known manner, thereby replacing the defective column or row of memory cells with the redundant column or row of memory cells, and thus enabling the defective chip to be relieved.

A memory device having such a redundant circuit involves necessity to know information about relief of the memory cell, that is whether or not the redundant circuit has been actually used, and the address of a defective part in the normal memory cell array which has been replaced with the redundant column or row, when the memory is evaluated or tested. Conventional practices therefor include a roll call circuit which is arranged such that a special circuit is provided in a memory chip to obtain relief information.

One approach for indicating whether the redundant circuit is actually used and which address of the normal memory array is replaced by the redundant structure is disclosed in the U.S. Pat. No. 4,731,759 issued to Watanabe. According to this U.S. Patent, a series circuit of field effect transistors is inserted between two power voltage terminals (Vcc and GND). The series circuit causes a DC current flowing the two power voltage when the redundant circuit is used for replacing the defective portion of the normal memory array. Therefore, by checking an amount of the DC current flowing through the two power voltage terminals, the usage of the redundant circuit can be known.

However, it is difficult to accurately measure the current flowing through the series circuit, because the memory circuit consumes an operating current which also flows between the two power voltage terminals. Moreover, the series circuit always consumes some current flowing therethrough at least when the memory circuit is enabled in a case where the redundant circuit is used. This consumes a wasteful power.

SUMMARY OF THE INVENTION

It is an object of the present invention to provide a semiconductor memory device provided with a novel system for detecting the usage of the redundant circuit with ease.

It is another object of the present invention to provide a semiconductor memory device having an improved system for detecting the memory position replaced with the redundant circuit operable without causing any wasteful current consumption.

A semiconductor memory device according to the present invention comprises a plurality of normal memory cells arranged in an array, at least one redundant memory cell, means for receiving address information, a selection circuit coupled to the array of the normal memory cells and the redundant memory cell, the selection circuit operatively selecting one memory cell from the array of the normal memory cells in accordance with the address information when the normal memory cell corresponding to the address information is operable and selecting the redundant memory cell when the normal memory cell corresponding to the address information is defective, a read-write circuit coupled to the selection circuit for performing a read operation of the selected memory cell in a read mode and a write operation to the selected memory cell in a write operation, a power voltage terminal for receiving a power voltage, a detection circuit coupled to the power voltage terminal for generating a detection signal when the power voltage is initiated to be applied the power voltage terminal, a first initializing circuit for setting the normal memory cells at a first logic state in response to the detection signal, and a second initializing circuit for setting the redundant memory cell at a second logic state different from the first logic state in response to the detection signal.

According to the present invention, the normal memory cells and the redundant memory cell are automatically initialized in different logic states, respectively upon the application of the power voltage to the memory circuit. Therefore, the address of the defective memory cell which is replaced by the redundant memory cell can be detected by simply checking read-out data. Any wasteful current does not flow for showing the using state of the redundant memory cell.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Prior Art

A conventional indicator circuit for indicating a using state of a redundant circuit in a memory circuit will be explained with reference to FIG. 1.

A program circuit 1 includes a series connection of a fuse F and an N-channel MOS field effect transistor $Q_1$ connected between a power voltage terminal Vcc and a reference voltage terminal (GND) and a feed-back inverter $IV_1$ to form a fuse type flip-flop.

Figure 1:
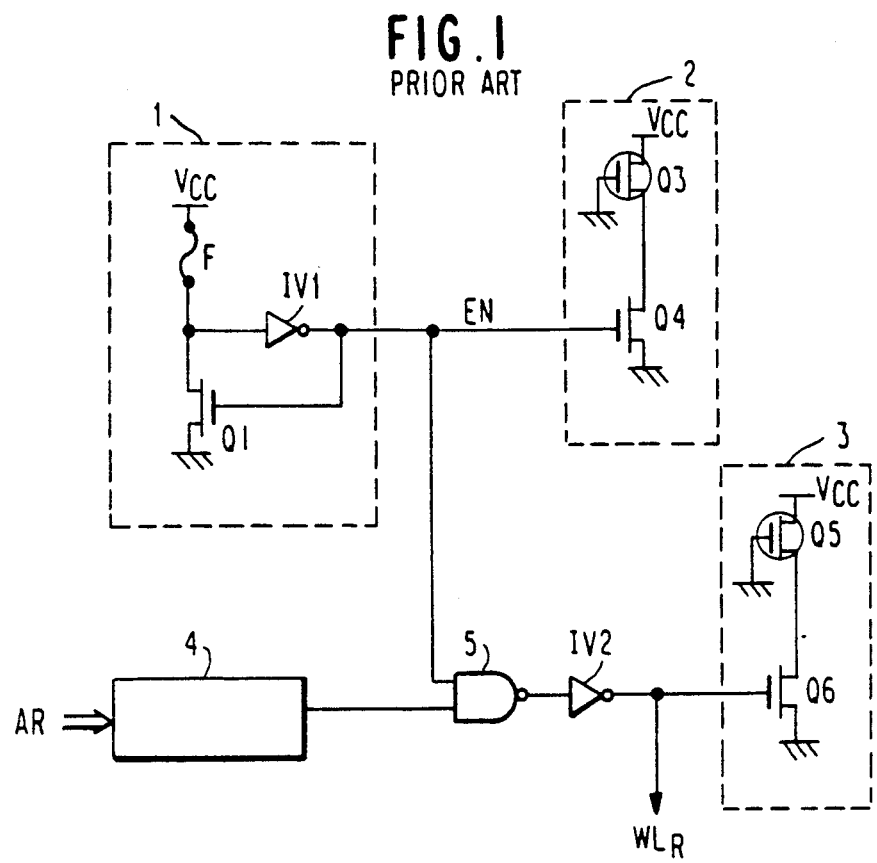
FIG. 1 is a schematic block diagram of an indicator circuit for a redundant circuit in the prior art.

The fuse F is cut when a redundant circuit including a redundant word line WLR, a redundant row decoder 4, a gate 5 and an inverter $IV_2$ is utilized for replacing a defective word of a normal memory cell array (not shown in FIG. 1). Therefore, a signal EN is set at a high level. To the contrary, when the normal memory array is perfectly good and the redundant circuit is not used, the fuse F is not cut to produce a low level of the signal EN. When the redundant circuit is used, the address of a defective part, e.g. word line to be replaced with a redundant word line WLR is programmed in the redundant decoder 4 in a known way. Accordingly, when address information AR indicates the address of the defective part, the output of the redundant decoder 4 is selected to select the redundant word line through the gate 5 and the inverter $IV_2$ in response to the high level of EN. A first roll-call circuit 2 having a P-channel MOS (PMOS) transistor $Q_3$ and an N-channel MOS (NMOS) transistor $Q_4$ causes a current flowing therethrough between Vcc and GND when the signal EN is at the high level. A second roll-call circuit 3 including a PMOS transistor $Q_5$ and an NMOS transistor $Q_6$ connected between Vcc and GND and causes a current flowing between Vcc and GND when the redundant word line is selected.

Thus, in the case where the redundant circuit is used, the signal EN is at the high level and therefore $Q_4$ is ON, so that the roll call circuit 2 constantly generates a current from the power supply to the ground (GND). For this reason, the current consumption is greater than in a memory in which the redundant circuit is not used by an amount corresponding to the current flowing through the roll call circuit 2.

In the memory wherein a redundant circuit is used, when the address of the defective part which has been replaced with the redundant circuit is selected, the output of the redundant decoder 4 is at a high level and the redundant word line WLR is at a high level. As a result, $Q_6$ turns ON and the roll call circuit 3 generates a current from the power supply Vcc to the ground. When another address is selected, the output of the redundant decoder 4 is at a low level and WLR is also at a low level, so that $Q_6$ turns OFF. Therefore, no current flows through the roll call circuit 3. Accordingly, the current consumption at the time when the address of a defective part replaced with the redundant circuit is selected is greater than that in the case where another address is selected. Thus, by checking the current consumption of the memory and the current that is consumed when each address is selected, it is possible to obtain information about whether or not the redundant circuit has been used and information about the address of a defective part replaced with the redundant column or row.

The above-described prior art has the disadvantages that the current consumption of the memory is increased because of the use of the redundant circuit and it is time-consuming since it is necessary to check, for all the addresses, the current that is consumed when each address is selected.

Embodiments

Figure 2:
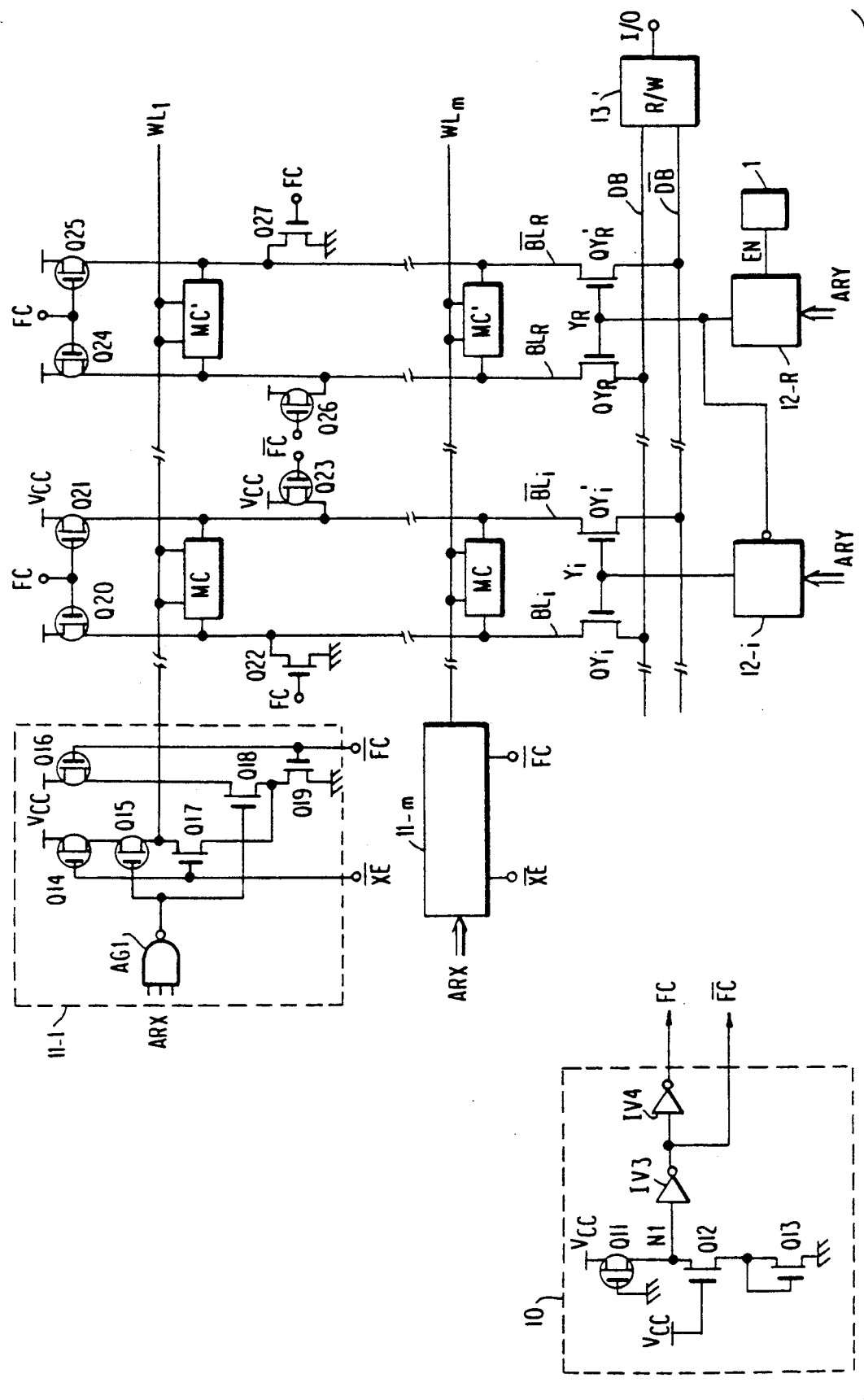
FIG. 2 is a schematic block diagram showing a memory device according to one embodiment of the present invention.

With reference to FIG. 2, the memory device according to a first embodiment of the present invention will be explained below.

Figure 4:
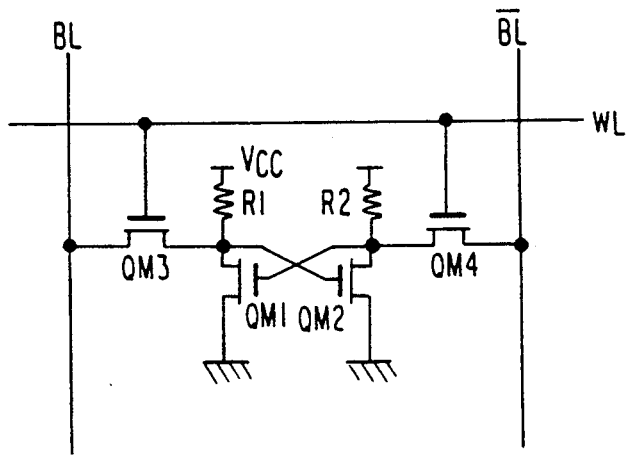
FIG. 4 is a schematic circuit diagram showing a memory cell.

The memory device comprises a normal memory array having a plurality of normal memory cells MC, a plurality of word lines $WL_l - WL_m$ arranged in rows, and a plurality of pairs of bit lines $BL, \overline{BL}$ (in the drawing, only i-th pair of bit lines $BL_i, \overline{BL}_i$ are representatively shown), and a redundant array of redundant memory cells MC' coupled to the word lines $WL_l - WL_m$ and a pair of redundant bit lines $BL_R, \overline{BL}_R$. Thus, in this memory, a redundant column of memory cell MC' are provided for replacing a defective column of memory cells of the normal memory array. Each of the memory cells MC and the redundant memory cells MC' is constructed as shown in FIG. 4. Namely, the memory cells MC and MC' include a flip-flop composed of load resistors R1, R2 and a pair of NMOS transistors $Q_{M1}$, $\overline{Q_{M1}}$, and a pair of transfer gate NMOS transistors $Q_{M3}$, $Q_{M4}$ coupled to one word line WL and a pair of bit lines $BL, \overline{BL}$.

A plurality of row decoders 11-1 to 11-m are provided for selecting the word lines $WL_l - WL_m$, respectively. The pairs of bit lines $BL_i, \overline{BL}_i, BL_R, \overline{BL}_R$ and connected to a pair of bus lines $DB, \overline{DB}$ connected to a read-write circuit 13 connected to an input/output terminal I/O through a plurality of pairs of transfer gate NMOS transistors $QY_i, QY_i', QY_R, QY_R'$. Each pair of transfer gate transistors ($QY_i, QY_i'$) are selected by the corresponding column decoder (12-i) and the pair of transistors $QY_R, QY_R'$ for the redundant column are selected by the redundant column decoder 12-R. The redundant column decoder 12-R is enabled in response to the high level of the signal EN generated from the program circuit 1 such as shown in FIG. 1 and generates an active (high) level of output $Y_R$ when column address information ARY indicates a defective column of the normal array. The selective level of $Y_R$ inhibits operations of the normal column decoders such as 12-i. The memory circuit also includes a power-on detection circuit 10 including PMOS transistor $Q_{11}$ and NMOS transistors $Q_{12}, Q_{13}$ connected in series between Vcc and GND and inverters $IV_3$ and $IV_4$. The power-on detection 10 a high level pulse signal FC and a low level pulse signal $\overline{FC}$ when the power voltage Vcc is switched on, as will be explained in detail later.

Each of the row decoders 11-1 to 11-m includes a NAND gate AG1 receiving row address signals ARX, PMOS transistors $Q_{14}, Q_{15}, Q_{16}$ and NMOS transistors $Q_{17}$ to $Q_{19}$ and is enabled to select its corresponding word line in accordance with ARX in response to a low level of a control signal $\overline{XE}$ and selects its corresponding word line irrespective of ARX when the pulse signal $\overline{FC}$ is at the low level. In the normal memory array, as shown in by way of the pair of bit lines $BL_i, \overline{BL}_i$, an NMOS transistor $Q_{22}$ receiving FC at its gate is connected between the true bit line $BL_i$ and the ground voltage source and a PMOS transistor $Q_{33}$ having a gate receiving $\overline{FC}$ is connected between Vcc and the ground voltage source. While a PMOS transistor having a gate receiving $\overline{FC}$ and an NMOS transistor receiving FC at its gate are connected between the true bit line $BL_R$ and Vcc and the complementary bit line $\overline{BL}_R$ and the ground voltage source, respectively.

Load PMOS transistors $Q_{20}, Q_{21}, Q_{24}, Q_{25}$ for the bit lines $BL_i, \overline{BL}_i, BL_R, \overline{BL}_R$ are controlled by FC.

Figure 3:
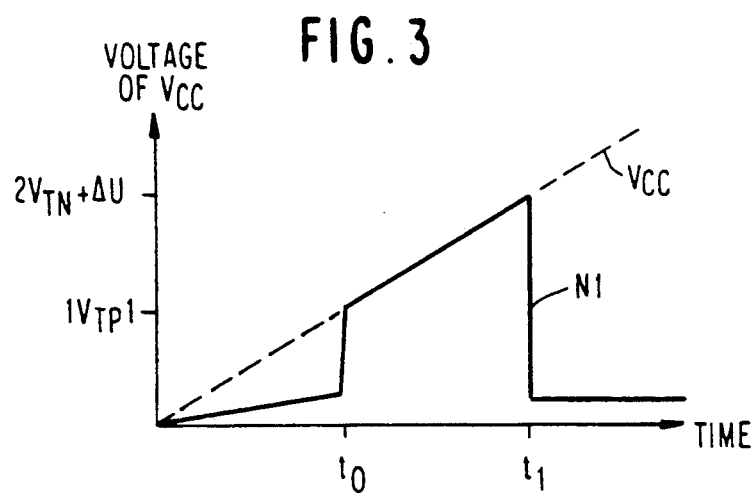
FIG. 3 is a timing diagram showing an operation of a power-on detection circuit employed in the memory device of FIG. 2.

The operation of the power-on detection circuit 10 will first be explained with reference to FIG. 3. The threshold voltage VTN of the NMOSFET transistors $Q_{12}, Q_{13}$ is set so as to be greater than the absolute value $|VTP|$ of the threshold voltage of the PMOSFET transistor $Q_{11}$, i.e., $|VTP| < VTN$. When the power supply voltage Vcc which gradually rises from 0V and becomes equal to $|VTP|$ at a time t0, $Q_{11}$ turns ON, so that the node N1 rises to a potential which is equal to Vcc. When Vcc becomes equal to $2VTN + \Delta v$ at a time t1, $Q_{12}$ and $Q_{13}$ turn ON in addition to $Q_{15}$, wherein $\Delta v$ is an increase in the threshold voltage of the NMOSFET transistors caused by the substrate bias effect of $Q_{12}$. If $Q_{12}$ and $Q_{13}$ which are series-connected have an extremely greater current capacity than that of $Q_{11}$, the potential at N1 falls at the time t1, as shown in FIG. 3. As has been described above, in the process of the gradual rise of the power supply voltage Vcc from 0 V, the potential at the node N1 forms a pulse signal such as that shown in FIG. 3. Accordingly, FC which is a pulse signal of the same phase as N1, and $\overline{FC}$ which is a pulse signal of the opposite phase to N1 are generated. The following is a description of the circuit operation by which "0" and "1" are respectively written into normal memory cells MC and the redundant memory cells MC' in synchronism with the pulse signals FC and $\overline{FC}$ which are generated when it is detected that the power supply has been turned ON. When FC change from the low level to the high level and $\overline{FC}$ changes from the high level to the low level as a result of the detection that the power supply has been turned ON, $Q_{16}$ of the row decoders turns ON, while $\overline{Q_{16}}$ turns OFF. Thus, the word lines $WL_1 - WL_m$ are forcedly raised to the high level irrespective of the address ARX and the level of $\overline{XE}$. As FC changes from the low level to the high level, $Q_{20}$ and $Q_{21}$ turn OFF, while $Q_{22}$ and $Q_{23}$ turn ON. Accordingly, $BL_i$ is set at the GND level, while $\overline{BL}_i$ is set at the Vcc level. Thus, "0" is written into the normal memory cells MC. Similarly, $Q_{24}$ and $Q_{25}$ turn OFF, while $Q_{26}$ and $Q_{27}$ turn ON, so that $BL_R$ is set at the Vcc level, while $\overline{BL}_R$ is set at the GND level. Thus, "1" is written into the redundant memory cells MC'. Then, when $\overline{FC}$ changes from the low level to the high level, while FC changes from the high level to the low level, $Q_{16}$, $Q_{22}$, $Q_{23}$, $Q_{26}$ and $Q_{27}$ turn OFF, while $Q_{19}$ to $Q_{21}$, $Q_{24}$ and $Q_{25}$ turn ON, so that the row decoders and memory cell peripheral circuits become equivalent to those in ordinary memories. Thus, it is possible to effect read and write operations.

As has been described above, after the power supply has been turned ON, "0" and "1" are respectively written into all the normal memory cells and all the redundant memory cells and, thereafter, the operation mode is shifted to an ordinary read or write mode.

By virtue of the above-described operation, if information stored in the memory is read out in the address order without performing a write operation after the power supply has been turned ON, "1" is output from an address where the normal memory cell has been replaced with a redundant memory cell, while "0" is output from an address where the normal memory cell has not been replaced. It is therefore possible to obtain information about the address of a normal memory cell replaced and information about whether or not the redundant circuit has been used, that is, memory relief information, by checking read-out information in the address order.

Although all the word lines $WL_1 - WL_m$ are selected upon the power-on of Vcc in the memory of FIG. 2, it is also possible to select a predetermined one word line. In this case, it is necessary to select this predetermined word line for checking the address replaced by the redundant column.

Figure 5:
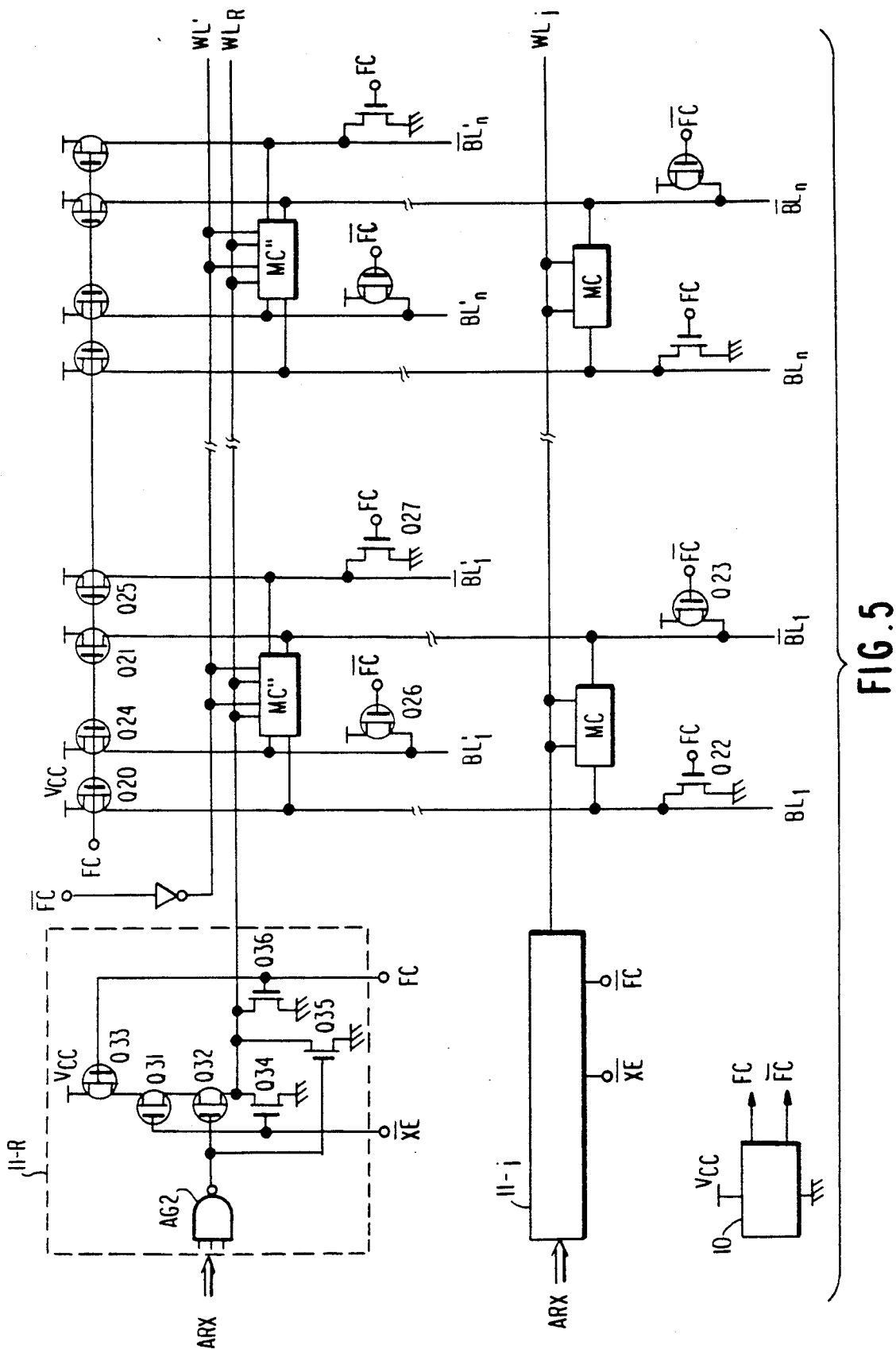
FIG. 5 is a schematic block diagram showing a memory device according to another embodiment of the present invention.
Figure 6:
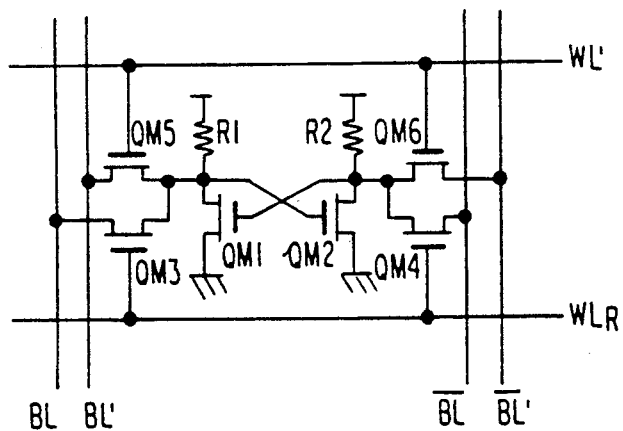
FIG. 6 is a schematic circuit diagram of a redundant memory cell employed in the memory of FIG. 5.

With reference to FIGS. 5 and 6, a memory circuit according to a second embodiment of the present invention will be explained. In the memory of this embodiment, a redundant row of memory cells MC" are provided for replacing a defective row of memory cells MC in a normal memory cell array. In FIGS. 5 and 6, elements or portions corresponding to those in the previous drawings are denoted by the same or similar references. The normal memory cells MC have the same structure as those in FIG. 2, as shown in FIG. 4. The redundant row of memory cells MC" are constructed as shown in FIG. 6. Namely, NMOS transistors $Q_{M5}$ and $Q_{M6}$ connected to a control line WL' and a pair of data set lines BL' and $\overline{BL}'$ of the corresponding column are provided in addition to the memory cells MC shown in FIG. 4.

The normal row decoders such as 11-j for the normal memory array (MC) have the same structure as those 11-l to 11-m of FIG. 2, while a redundant row decoder 11-R includes PMOS transistors $Q_{31} - Q_{33}$ and NMOS transistors $Q_{34} - Q_{36}$ and is enabled in response to the low level of $\overline{XE}$. The output (i.e. $WL_R$) of the redundant row decoder is forcibly set at the low level in response to the high level of FC.

When $\overline{FC}$ changes from the high level to the low level, while FC changes from the low level to the high level, as a result of the detection that the power supply has been turned ON, $Q_{33}$ in the redundant row decoder 11-R turns OFF, while $Q_{36}$ therein turns ON, so that the redundant word line WLR in the redundant memory cells MC" is forcedly shifted to the low level irrespective of the address input ARX and the level of $\overline{XE}$. On the other hand, the other word line WL' which is paired with WLR is raised to the high level. The word lines such as WLj in the normal memory cell array are forcedly raised to the high level in the same way as in the first embodiment. Simultaneously, $Q_{20}$ and $Q_{21}$ turn OFF, while $Q_{22}$ and $Q_{23}$ turn ON, so that the bit lines $BL_1 - BL_n$ are set at the GND level, while the bit lines $\overline{BL}_1 - \overline{BL}_n$ are set at the Vcc level. Thus, "0" is written into all the normal memory cells MC. While the transistors $Q_{24}$ and $Q_{25}$ turn OFF, and $Q_{26}$ and $Q_{27}$ turn ON, so that the data set lines $BL'_1 - BL'_n$ for the redundant memory cells MC" are at the Vcc level, while the data set lines $\overline{BL}'_1 - \overline{BL}'_n$ are set at the GND level. Thus, "1" is written into all the redundant memory cells MC. When $\overline{FC}$ changes from the low level to the high level, while FC changes from the high level to the low level, $Q_{36}$, $Q_{22}$, $Q_{23}$, $Q_{26}$ and $Q_{27}$ turn OFF, while $Q_{33}$, $Q_{20}$, $Q_{21}$, $Q_{24}$ and $Q_{25}$ turn ON. Accordingly, the normal and redundant row decoders and peripheral circuits become equivalent to those in ordinary memories and it is therefore possible to carry out read and write operations in the same way as in the first embodiment.

The method of obtaining memory relief information in this memory is the same as in the first embodiment, and the memory having a redundant row in this embodiment also exhibits advantageous effects similar to those of the memory having a spare column in the first embodiment.

As has been described above, the present invention provides a memory circuit having a redundant circuit, comprising a power-on detection circuit which generates a pulse signal when detecting that the power supply has been turned on, and a circuit capable of writing "0" (or "1") into all normal memory cells and "1" (or "0") into all redundant memory cells in synchronism with the pulse signal, whereby it is possible to obtain memory relief information within a short period of time by such an easy method that information stored in the memory cells is read out in the address order after the power supply is switched ON, without any increase in the current consumption which has heretofore been caused by a circuit provided to obtain relief information.

What is claimed is:

1. A semiconductor memory device comprising:
   a plurality of normal memory cells;
   at least one redundant memory cell;
   means for receiving address information;
   a selection circuit coupled to said normal memory cells and said redundant memory cell, said selection circuit operatively selecting one of said normal memory cells in accordance with said address information when said normal memory cell corresponding to said address information is operable and selecting said redundant memory cell when said normal memory cell corresponding to said address information is defective;
   a read-write circuit coupled to said selection circuit for performing a read operation of the selected memory cell in a read mode and a write operation to the selected memory cell in a write operation;
   a power voltage terminal for receiving a power voltage;
   a detection circuit coupled to said power voltage terminal for generating a detection signal when said power voltage is initiated to be applied to said power voltage terminal;
   a first initializing circuit for setting said normal memory cells at a first logic state in response to said detection signal; and
   a second initializing circuit for setting said redundant memory cell at a second logic state different from said first logic state in response to said detection signal.

2. The memory device according to claim 1, wherein each of said normal memory cells and said redundant memory cell includes a flip-flop circuit.

3. The memory device according to claim 1, further comprising normal bit lines coupled to said normal memory cells and a redundant bit line coupled to said redundant bit line.

4. The memory device according to claim 3, in which said first initializing circuit includes means for providing a first logic level to said normal bit lines in response to said detection signal, and said second initializing circuit includes means for providing a second logic level to said redundant bit line in response to said detection signal.

5. The memory device according to claim 3, further comprising a bus line coupled to said read-write circuit, and said selection circuit includes a plurality of first transfer gates connected between said normal bit lines and said bus line and a second transfer gate connected between said redundant bit line and said bus line.

* * * * *

UNITED STATES PATENT AND TRADEMARK OFFICE
CERTIFICATE OF CORRECTION

PATENT NO. : 5,008,857
DATED : April 16, 1991
INVENTOR(S) : Akane MIZOGUCHI

It is certified that error appears in the above-identified patent and that said Letters Patent is hereby corrected as shown below:

Column 5, line 20, delete "FC and FC", insert --FC and $\overline{FC}$--;

Column 5, line 35, delete "$BL_R$", and insert --$\overline{BL_R}$--;

Column 6, line 14, delete "BL' and BL'", and insert --BL' and $\overline{BL'}$--

Signed and Sealed this

Twentieth Day of October, 1992

Attest:

DOUGLAS B. COMER

*Attesting Officer*  *Acting Commissioner of Patents and Trademarks*